United States Patent [19]

Aizawa

[11] 4,417,155

[45] Nov. 22, 1983

[54] ANTI-CHATTER CIRCUIT FOR SMALL PORTABLE APPARATUS

[75] Inventor: Hitomi Aizawa, Suwa, Japan

[73] Assignee: Kabushiki Kaisha Suwa Seikosha, Chuo, Japan

[21] Appl. No.: 277,293

[22] Filed: Jun. 25, 1981

[30] Foreign Application Priority Data

Jun. 26, 1980 [JP] Japan .................................. 55-87058

[51] Int. Cl.³ .......................................... H03K 17/56
[52] U.S. Cl. .................................. 307/247 A; 307/246
[58] Field of Search ........................... 307/247 A, 269

[56] References Cited

U.S. PATENT DOCUMENTS 3,624,518 11/1971 Dildy, Jr. ............................ 307/269
3,694,667 9/1972 Staker, Jr. ........................... 307/269
4,030,284 6/1977 Portmann ....................... 307/247 A
4,057,738 11/1977 Nishimura ..................... 307/247 A
4,198,579 4/1980 Ebihara et al. ................. 307/247 A Primary Examiner—John S. Heyman
Assistant Examiner—Timothy P. Callahan
Attorney, Agent, or Firm—Blum, Kaplan, Friedman, Silberman & Beran

[57] ABSTRACT

A signal produced by connecting the electrical contacts of a mechanical switch is read into a circuit without chatter only when the switch is closed longer than a selected time period. A first memory stores and outputs a switch actuation signal on the occurrence of a read signal, and erases the stored signal when the switch actuation signal is removed. A second memory outputs a square wave pulse on the coincidence of a later read signal and the first memory output. Electrical noise lasting less than the selected time period does not produce an output. The selected time period can be varied by using independent, phase-shifted read signals for each memory.

11 Claims, 8 Drawing Figures

FIG.7
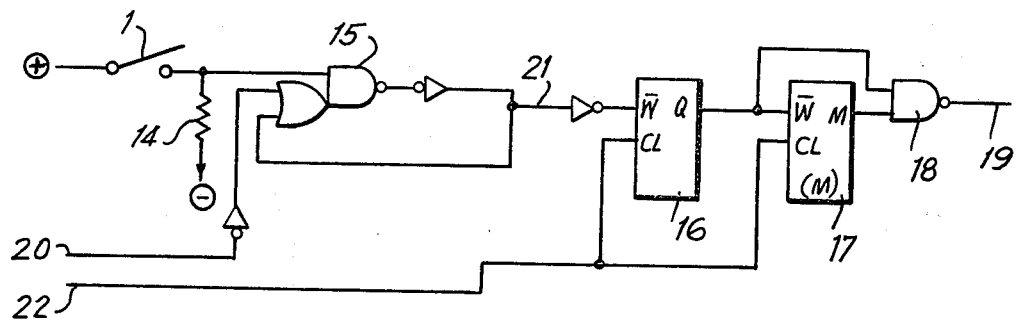
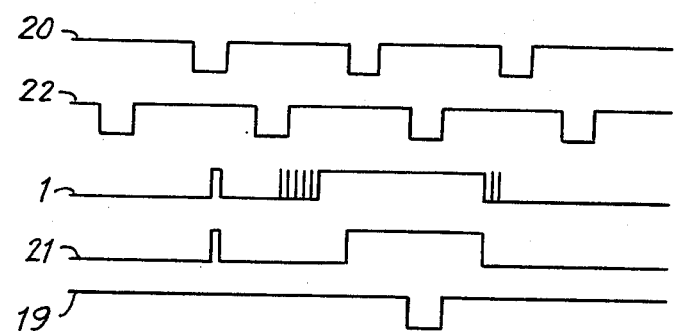
FIG.8

ANTI-CHATTER CIRCUIT FOR SMALL PORTABLE APPARATUS

BACKGROUND OF THE INVENTION

This invention relates generally to an anti-chatter circuit used to clean up the input produced by a mechanical contact closing switch and more particularly, to an anti-chatter circuit which discriminates between true switch inputs and inputs of electrical noise. Many circuits have been devised to provide clear square wave pulse inputs to a circuit upon the making of a connection between electrical contacts. The irregular waveform actually produced when the mechanical contacts come together is "smoothed over" in the anti-chatter circuit and a uniform output pulse is produced every time the contacts are brought together for an electrical connection. However, there is a possibility of erroneous circuit operation when electrical noises other than the switch input are introduced at the input terminal of the circuit. In a small sized portable apparatus such as an electronic watch, there has not been a problem because the conventional electronic watch includes no internal source of electrical noises. Further, the metal case of the watch shields the circuit input from the intrusion of externally generated electrical noises. However, electronic watches are becoming more and more versatile and complex and include such objects as loudspeakers and other electromechanical converters. Thus, there is a source for generating electrical noises within the casing. Also, in some watches the case is made of a plastic or other insulating material which permits electromagnetic waves to pass through. This increases the possibility of introducing noises, that is, erroneous signals into the input of the switch circuit.

What is needed is an anti-chatter circuit which discriminates between true switch closings and undesired electrical noise signals which can actuate the circuitry associated with the switch.

SUMMARY OF THE INVENTION

Generally speaking, in accordance with this invention, an anti-chatter circuit especially suitable for small portable apparatuses is provided. A signal produced by connecting the electrical contacts of a mechanical switch is read into a circuit without chatter only when the switch is closed longer than a selected time period. A first memory stores and outputs a switch actuation signal on the occurrence of a read signal, and erases the stored signal when the switch actuation signal is removed. A second memory outputs a square wave pulse on the coincidence of a later read signal and the first memory output. Electrical noise lasting less than the selected time period does not produce an output. The selected time period can be varied by using independent, phase-shifted read signals for each memory.

Accordingly, it is an object of this invention to provide an improved anti-chatter circuit for small portable apparatus which prevents chattering in switch inputs and eliminates erroneous operation due to noises such as electrostatic noises, existing in the switching inputs.

Another object of this invention is to provide an improved anti-chatter circuit for small portable apparatus which causes a low current drain on the power supply when the switch is actuated.

A further object of this invention is to provide an improved anti-chatter circuit for a small portable apparatus which discriminates between noise signals and true switch signals by the duration of said signals.

Still other objects and advantages of the invention will in part be obvious and will in part be apparent from the specification.

The invention accordingly comprises the features of construction, combination of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 7 is an alternative anti-chatter circuit in accordance with this invention; and FIG. 8 is waveforms associated with the anti-chatter circuit of FIG. 7.

DESCRIPTION OF THE PREFERRED EMBODIMENTS

Figure 1:
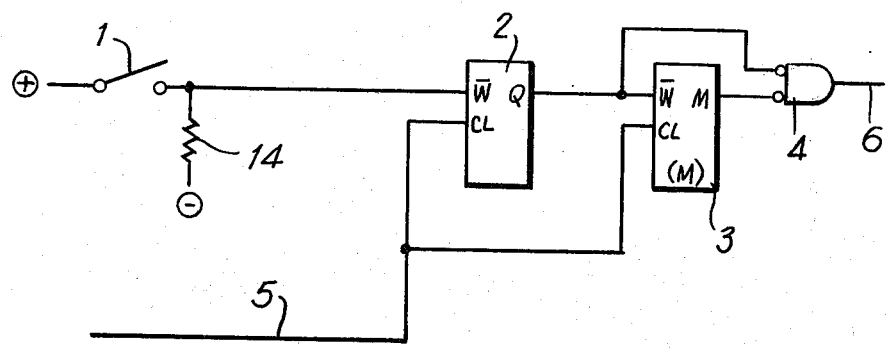
FIG. 1 is an anti-chatter circuit for a switch input.
Figure 2:
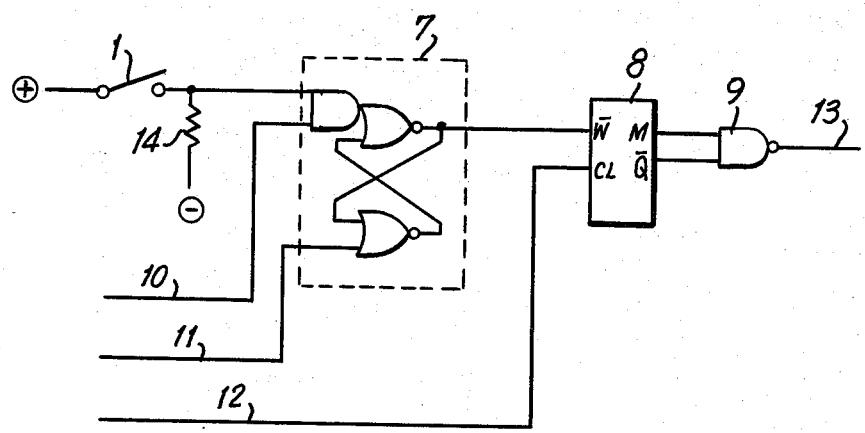
FIG. 2 is another anti-chatter circuit for a switch input.

FIGS. 1 and 2 shown anti-chatter circuits which have been previously developed. A mechanical switch 1 applies a high (+) signal to the $\overline{W}$ input terminal of a flip-flop 2 when the switch is closed. Otherwise the input terminal $\overline{W}$ of the flip-flop 2 is at a low potential (−) through a resistance 14. The Q output of the flip-flop 2 is inputted to the $\overline{W}$ terminal of a latch 3 and to an inverted input of an AND gate 4. The flip-flop 2 and latch 3 are clocked by a common signal provided on the line 5, said signal 5 being a periodic square wave.

Figure 3:
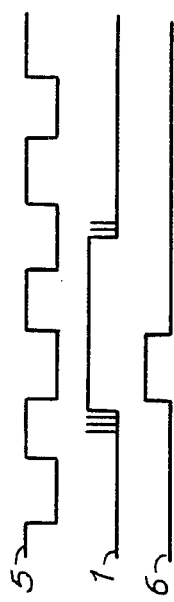
FIG. 3 is waveforms associated with the circuit of FIG. 1.

In FIG. 1, the logic levels 0 and 1, that is, low and high, − and +, obtained by the opening and closing of the switch 1 are read into the flip-flop 2 at the moment the read signal 5 goes low. The output of the flip-flop 12 is differentiated by the latch 3 and the gate 4 having two inverted inputs, so as to obtain an output signal 6. The timed relationship of the signals is shown in the waveforms of FIG. 3.

In the anti-chatter circuit of FIG. 1, because the switch input is read at the time that the read signal 5 goes low, as described above, there is no possibility of erroneous readings insofar as no chatter occurs at the same timing. Even when chatter occurs at that timing, if the duration period of the chatter is shorter than one period of the read signal cycle 5, the number of switch inputs read into the flip-flop 2 never exceeds the actual number of the switching operations. Although the circuit of FIG. 1 has the advantageous feature described above, there is a possibility of erroneous operation when noises other than those from the switch input are introduced into the input terminal at the time when the signal 5 reads into the flip-flop.

Figure 4:
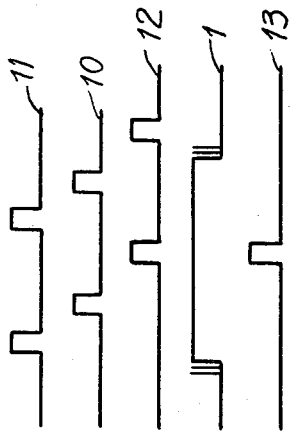
FIG. 4 is waveforms associated with the circuit of FIG. 2.

Another anti-chatter circuit, shown in FIG. 2 is also used for the same purposes. In this circuit, the input condition of a switch 1 is read into a R-S type flip-flop 7 when a read signal 10 is at the high logic level. The output of the flip-flop 7 is differentiated by another flip-flop 8 and a NAND gate 9. FIG. 4 shows the timing of signals in the circuit of FIG. 2. This circuit also has the same problems as are associated with the circuit of FIG. 1. In particular, when noises are introduced while the read signal 10 is at a high level, erroneous results are likely to be produced.

As previously stated, in the situation where the small portable apparatus is an electronic watch, there is no problem because a conventional electronic watch includes no internal source of electrical noises. Also, the metal case of the watch shields the electronic circuits from the intrusion of external electrical noises. However, electronic watches are becoming more and more complex and versatile. A wristwatch may now include a loudspeaker or other electromechanical converter which can constitute a source of electrical noises within the casing. Frequently, the casing of the watch is made of plastic or other insulating materials which does not produce a shielding effect. These features increase the possibility and danger of introducing stray electrical noises into the switch circuit.

A reduction in the size of the resistor 14 shown in FIGS. 1 and 2 may be considered as a means for eliminating these noises as erroneous circuit triggers. However, reduction in resistance tends to increase the electric current at the time when the switch 1 is closed and thereby to shorten the operational life of the power source cell, usually a miniature battery. Further, an extreme reduction in the resistance of the resistor 14 gives rise to a problem in relation to the contact resistance of the switch 1. Such difficulties which can exist in an electronic watch also exist in portable electronic calculators.

Figure 5:
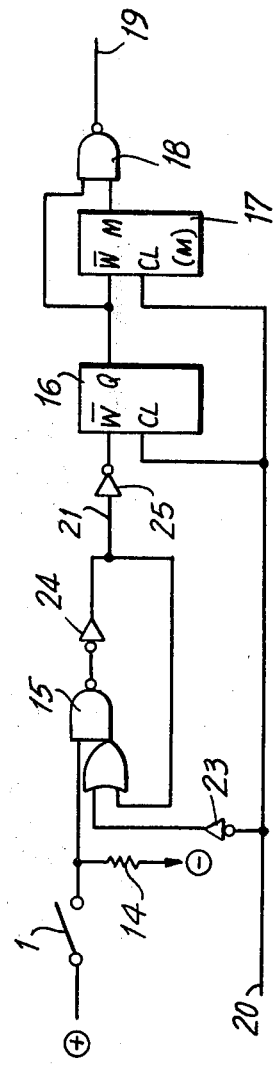
FIG. 5 is a circuit diagram of an anti-chatter circuit in accordance with this invention.
Figure 6:
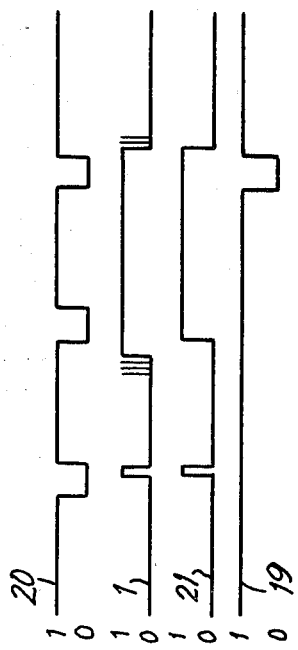
FIG. 6 is waveforms associated with the anti-chatter circuit of FIG. 5.

The anti-chatter circuit in accordance with this invention provides a circuit for a small portable apparatus wherein all of the above described disadvantages are substantially eliminated. The anti-chatter circuit in accordance with this invention is now described with reference to the accompanying drawings. With reference to FIG. 5, a memory circuit 15 is comprised of an OR-NAND gate combination. The NAND gate receives a high input when the switch 1 is closed and the OR gate receives a read signal 20 through an inverter 23. The output from the NAND gate passes through inverters 24,25 and is inputted into the $\overline{W}$ terminal of a D-type flip-flop 16. The output of the D-type flip-flop 16 is differentiated by a latch 17 in combination with a NAND gate 18 to produce an output signal 19. The read signal 20 is also inputted to the clock terminals of the flip-flop 16 and latch 17.

When the switch 1 is closed, the switch input (+) is read into the memory circuit 15 composed of the OR-NAND gates only when the read signal 20 is at the low level. A high signal 21 is then read into the second memory 16 through the inverter 25, when the read signal 20 again goes low. The output of the second memory circuit is differentiated by the latch 17 and gate 18 to produce an output pulse signal 19. More specifically, the first memory circuit 15 reads the switch input initially only when the switch input is high and concurrently the read signal 20 is low. The output of the inverter 24 is fed back to the OR gate such that the output 21 remains high until the switch 1 is opened even though the read signal 20 has gone high. The content, that is, the output of the memory circuit 15 is immediately brought to the low or 0 state by the pull-down resistor 14 when the switch 1 is opened. Thus, the output of the first memory circuit 15 is not read into the second memory circuit 16 if the time duration of the switch input 1 is less than a predetermined value, which is the period of the read signal 20.

It should also be apparent that approximately two periods of the read signal 20 may be required in some instances to produce the desired pulse 19 depending upon the time relationship between the switch closing and the signal 20. For the sake of an example, one cycle period of the read signal 20 is 31.25 milliseconds and the time within that period where the read signal is at the low state is 1.95 milliseconds. Unless the time duration of the switch input is high for more than 29.3 milliseconds, the anti-chatter circuit in accordance with this invention does not deliver a differentiated signal 19 of the switch input.

In case of chattering caused by the switch operation, the duration of the chattering never exceeds 29.3 milliseconds, and furthermore, no electrical noise can create an input high having such a long duration. For this reason, the anti-chatter circuit in accordance with this invention accepts a switch input only when the input is obtained by an actual switching operation of the switch 1.

FIG. 7 is a circuit of an alternative embodiment of an anti-chatter circuit in accordance with this invention. In this embodiment which is substantially similar to the embodiment of FIG. 5, independent read signals 20,22 are used for the first memory circuit 15 and the second memory circuit 16, respectively. In particular, the memory circuit 15 operates on the read signal 20, whereas the D-type flip-flop 16 and the latch 17 operate on the clock signal 22. Operation of the circuit of FIG. 7, as demonstrated by the timing waveforms of FIG. 8, is substantially similar to the operation of the circuit of FIG. 5. The read signals 20,22 are identical but shifted in phase one from the other. Accordingly, the amount of phase shift between the signals, with read signal 20 leading the read signal 22, determines the minimum time of closure of switch 1 which is required to produce the output pulse signal 19.

In summary, in accordance with this present invention, erroneous operation of a small sized portable apparatus caused by switch chattering or electrical noises can be substantially eliminated. The size of the input resistor 14 against extraneous noises need not be considered. Thus, the pull-down resistor 14 can be of large size. As a result, current requirements are substantially reduced and the size of the power source cell can be substantially reduced as well. When a power source cell of the same size is used, operational life of the cell is substantially increased. Furthermore, since there is no need for considering erroneous operation of the switch due to electrical noises, the casing of the small portable apparatus may be made of any suitable material such as a plastic. Manufacturing costs of the apparatus can thereby be reduced substantially.

As described above, the anti-chatter circuit in accordance with the present invention is very advantageous for small portable apparatus and more particularly, for an electronic watch and a portable calculator, where further reductions in size and thickness are urgently needed.

It will thus be seen that the objects set forth above, among those made apparent from the preceeding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It also to be understood that the following claims are intended to cover all of the generic and specific features of the invention herein described, and all statements of the scope of the invention which, as a matter of language, may be said to fall therebetween.

What is claimed is:

1. An anti-chatter circuit for a small portable apparatus comprising:

switch means for providing a signal output indicative of the instantaneous open or closed condition of said switch means;

first memory means for storing the signal output of said switch, said first memory means being adapted to store and output an instantaneous closed switch signal when the occurrence of a first read signal is concurrent with said closed switch signal, said first read signal being input to said first memory means, said stored closed switch signal being maintained and output by said first memory means only so long as said switch is closed;

second memory means for storing the output of said first memory means, said second memory means being adapted to store an output upon the occurrence of a second read signal, said second read signal being inputted to said second memory means, said first read signal leading said second read signal;

differentiation circuit means for outputting a signal in response to the output of said second memory means, said signal from said differentiation circuit means occurs only when said switch closing signal persists for not less than the time between said first and second read signals.

2. An anti-chatter circuit for a small portable apparatus as claimed in claim 1, wherein said opening and closing of said switch means changes the state of said switch means signal output.

3. An anti-chatter circuit for a small portable apparatus as claimed in claim 2, wherein said first and second read signals comprise a series of periodic pulses.

4. An anti-chatter circuit for a small portable apparatus as claimed in claim 3, wherein said first and second read signals are the same series of periodic pulses, a first pulse and a second consecutive pulse respectively reading said signals into said first and second memories.

5. An anti-chatter circuit for a small portable apparatus as claimed in claim 2, wherein said first and second read signals both comprise a series of periodic pulses of the same frequency, said read signals being phase shifted such that said first read signal leads said second read signal, whereby the amount of phase shifting between said signals determines the minimum switch closing time which will produce an output from said differentiation circuit means.

6. An anti-chatter circuit for a small portable apparatus as claimed in claim 2, wherein said first memory means includes an OR-NAND gate combination, said switch signal output being one input to said NAND gate, said OR gate output being a second input to said NAND gate, said NAND gate having two inputs, said first read signal providing one input to said OR gate, an inverted output of said NAND gate providing a second input to said OR gate, said OR gate having two inputs, whereby when said closed switch signal is stored, said stored signal is continuously output only while said switch means is closed.

7. An anti-chatter circuit for a small portable apparatus as claimed in claim 6, wherein said second memory means includes a D-type flip-flop.

8. An anti-chatter circuit for a small portable apparatus as claimed in claim 7, wherein said differentiation circuit means includes a latch and a NAND gate, a first input to said NAND gate being the output of said second memory means and the input to said latch, the input to another input of said NAND gate being the output of said latch, said NAND gate having two inputs.

9. An anti-chatter circuit for a small portable apparatus as claimed in claim 7, wherein the same read signal is applied to said first memory means, said delay type flip-flop and said latch.

10. An anti-chatter circuit for a small portable apparatus as claimed in claim 9, wherein said read signal is a series of periodic pulses.

11. An anti-chatter circuit for a small portable apparatus as claimed in claim 8, wherein said first and second read signals are each a series of periodic pulses having the same frequency, said read signals being phase shifted one from the other, whereby said first read signal leads said second read signal.

* * * * *